(12) United States Patent
Rabeyrin

(10) Patent No.: US 11,134,589 B2
(45) Date of Patent: Sep. 28, 2021

(54) COOLING MODULE FOR AN ELECTRICAL POWER SUPPLY COMPARTMENT OF A RAILWAY VEHICLE, AND RELATED ELECTRICAL POWER SUPPLY COMPARTMENT AND RAILWAY VEHICLE

(71) Applicant: ALSTOM Transport Technologies, Saint-Ouen (FR)

(72) Inventor: Xavier Rabeyrin, Marseilles (FR)

(73) Assignee: ALSTOM TRANSPORT TECHNOLOGIES, Saint-Ouen (FR)

( * ) Notice: Subject to any disclaimer, the term of this patent is extended or adjusted under 35 U.S.C. 154(b) by 112 days.

(21) Appl. No.: 16/076,556

(22) PCT Filed: Feb. 9, 2016

(86) PCT No.: PCT/FR2016/050291
§ 371 (c)(1),
(2) Date: Aug. 8, 2018

(87) PCT Pub. No.: WO2017/137669
PCT Pub. Date: Aug. 17, 2017

(65) Prior Publication Data
US 2019/0045670 A1 Feb. 7, 2019

(51) Int. Cl.
*F25B 21/02* (2006.01)
*H05K 7/20* (2006.01)
(Continued)

(52) U.S. Cl.
CPC .......... *H05K 7/20863* (2013.01); *B60L 58/26* (2019.02); *F25B 21/02* (2013.01);
(Continued)

(58) Field of Classification Search
CPC .... F25B 21/02; F25B 21/04; F25B 2321/021; F25B 2321/0211; F25B 2321/023
See application file for complete search history.

(56) References Cited

U.S. PATENT DOCUMENTS 6,055,814 A  5/2000 Song
6,658,857 B1 * 12/2003 George ................... F25B 21/04
165/121

(Continued)

FOREIGN PATENT DOCUMENTS

DE  20301232  5/2003
DE  10218115  6/2003

OTHER PUBLICATIONS

DE20301232 translation.*
(Continued)

*Primary Examiner* — Brian M King
(74) *Attorney, Agent, or Firm* — B. Aaron Schulman, Esq.; Stites & Harbison, PLLC

(57) ABSTRACT

This cooling module (14A) comprises:
- an assembly of one or more Peltier cells comprising, on the inside, an internal heat transmission face and, on the outside, an external heat transmission face;
- an internal heat sink (46A) and an external heat sink (48A), which are in thermal contact, respectively, with the internal heat transmission face and the external heat transmission face; and
- at least one internal fan (50A) and at least one external fan (54A), which are respectively suitable to circulate an internal air flow through the internal heat sink (46A) and an external air flow through the external heat sink (48A).

9 Claims, 4 Drawing Sheets

(51) Int. Cl.
*B60L 58/26* (2019.01)
*H05K 5/02* (2006.01)

(52) U.S. Cl.
CPC ........... *H05K 5/0217* (2013.01); *H05K 7/209* (2013.01); *H05K 7/20854* (2013.01); *H05K 7/20909* (2013.01); *B60L 2200/26* (2013.01); *F25B 2321/021* (2013.01); *F25B 2321/023* (2013.01); *F25B 2321/0211* (2013.01); *F25B 2321/0212* (2013.01)

(56) References Cited

U.S. PATENT DOCUMENTS

| | | | |
|---|---|---|---|
| 2005/0126184 A1* | 6/2005 | Cauchy | F25B 21/02 62/3.3 |
| 2009/0000310 A1* | 1/2009 | Bell | B60H 1/00478 62/3.7 |
| 2012/0312030 A1* | 12/2012 | Lu | F25B 21/02 62/3.6 |

OTHER PUBLICATIONS

International Search Report for PCT/FR2016/050291, dated Oct. 27, 2016.
Written Opinion of the International Searching Authority for PCT/FR2016/050291, dated Oct. 27, 2016.

* cited by examiner

COOLING MODULE FOR AN ELECTRICAL POWER SUPPLY COMPARTMENT OF A RAILWAY VEHICLE, AND RELATED ELECTRICAL POWER SUPPLY COMPARTMENT AND RAILWAY VEHICLE

The object of the invention is a cooling module for an electrical power supply compartment of a railway vehicle. The invention also relates to a power supply compartment for a railway vehicle comprising such a cooling module and a railway vehicle comprising such an electrical power supply compartment.

In the field of rail transport, it is known to equip rail vehicles with electrical power compartments, inside which are housed components of an electrical power supply system of the railway vehicle. For example, electrical supply compartments positioned on the roof of a railway vehicle are known in order to reserve the inside of the railway vehicle for the use of passengers.

In the field of trams in particular, the components of the power system included in the electrical power supply compartments are generally intended to be supplied with electrical energy via a power supply rail on the ground arranged along the railway vehicle line, and an on-board sensing device that is suitable to interact with the power supply rail.

The components of the power supply system included in the power supply compartment are particularly suitable for receiving electrical energy from the power supply rail that is sensed by the sensing device, and generating power supply signals from the railway vehicle motors and/or payloads on board the railway vehicle, such as air conditioning, lighting, etc.

Such electrical power supply compartments generally need to be cooled in order to ensure optimum operation of the components of the power system they comprise.

It is thus known, in the field of electrical power compartments for railway vehicles, to use cooling systems implementing cooling ducts for circulating air between a heat exchanger and the inside of the electrical power supply compartment. It is also known to use air ducts between a passenger compartment and the interior of the power supply compartment in order to circulate air between the passenger compartment and the power supply compartment.

However, such cooling systems make the implementation of power supply compartments complex and lead to an increase in the volume necessary for the installation of electrical power supply compartments. The number of power supply compartments arranged on the roof and the constrained size of a railway vehicle, in particular a tram, make it necessary to optimize the volume occupied by the power supply compartments and the associated cooling control systems.

In addition, such cooling systems do not allow optimal cooling of the power supply compartments.

It is these drawbacks that the invention is suitable to remedy, in particular by proposing a cooling module for an electrical power supply compartment of a railway vehicle allowing optimized cooling of the power supply compartment and minimization of the volume necessary for the installation of the power supply compartment on the railway vehicle.

For this purpose, the object of the invention is a cooling module, an electrical power supply compartment and a railway vehicle according to the claims.

The invention will be better understood and other advantages will appear more clearly in the light of the description which follows, given solely by way of a non-limiting example, and with reference to the appended drawings, wherein.

Figure 1:
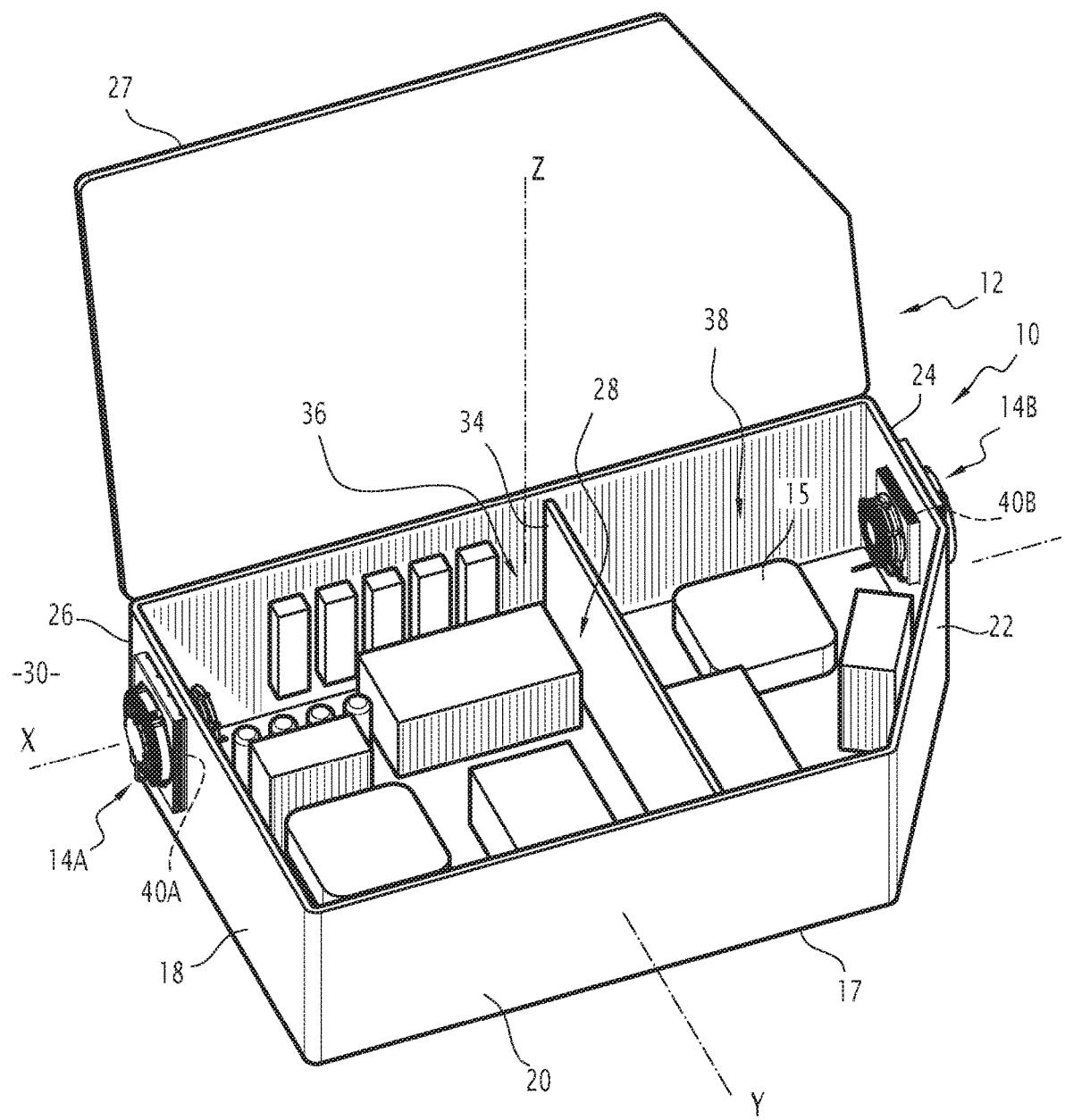
FIG. 1 shows a perspective representation of an electrical power supply compartment comprising two cooling modules according to a first embodiment of the invention.

In FIG. 1, an electrical power supply compartment 10 for a railway vehicle, such as a tram, is shown.

The electrical power supply compartment 10 is suitable to be mounted on a roof of the railway vehicle.

An XYZ frame is associated with the power supply compartment 10 so that the direction X coincides with a longitudinal axis of the compartment 10, the direction Y with a transverse horizontal axis of the compartment 10, and the direction Z with a vertical axis of the compartment 10. The Z axis is oriented from bottom to top in FIG. 1.

The electrical power supply compartment 10 comprises a protective housing 12 and first and second cooling modules 14A, 14B, fixed to the protective housing 12 and arranged generally symmetrically with respect to the YZ plane.

The electrical power supply compartment 10 also comprises a control member 15 for the cooling modules 14A, 14B and a seal 16A, 16B especially against water and dust, which is not visible in FIG. 1, for each cooling module 14A, 14B.

The protective housing 12 comprises a bottom wall 17, five side walls 18, 20, 22, 24, 26 and an upper wall 27, forming a closure cover of the housing 12. When this cover is closed against the side walls, the housing 12 delimits an inner space 28 and an outer space 30. The inner and outer spaces are isolated from each other.

In the remainder of the description, an element arranged inside the inner space 28 of the housing 12 as it is defined by the bottom walls 17, the upper wall 27 and side walls 18, 20, 22, 24, 26 is termed as being inside.

In the same way, an element arranged in the outer space 30, i.e. outside the inner space 28 or outside the housing 12, is termed outside.

In other words, the protective housing 12 defines an inner space 28 and an outer space 30 physically isolated from each other when the protective housing 12 is closed.

The protective housing 12 also comprises an inner wall 34 dividing the inner space 28 into a first inner volume 36 and a second inner volume 38.

More specifically, the lower wall 17, the upper wall 27 and the inner wall 34 isolate the first inner volume 36 from the second inner volume 38, which are sealed relative to each other.

The first inner volume 36 is intended to house power components of an electrical power supply system of the railway vehicle, while the second inner volume 38 is intended to house control means of the electrical power supply control system.

The protective housing 12 comprises, on the side walls 18, 24, a cutout 40A, 40B, for example rectangular, to receive the first cooling module 14A or, respectively, the second cooling module 14B. Each cutout 40A, 40B defines an opening through the corresponding wall of the housing 12.

The first cooling module 14A is installed in the receiving cutout 40A and is attached to the sidewall 18, while the second cooling module 14B is installed in the receiving cutout 40B and is attached to the sidewall 24.

More specifically, the first cooling module 14A is mounted on the side wall 18 between the outer space 30 and the first inner volume 36, while the second cooling module 14B is mounted on the side wall 24 between the outer space 30 and the second inner volume 38.

The cooling modules 14A and 14B are identical. In the remainder of the description, only the elements forming the cooling module 14A will be described in detail. As the elements forming the cooling module 14B are identical to those of the module 14A, they bear the same reference number, but the letter B replaces the letter A.

Figure 2:
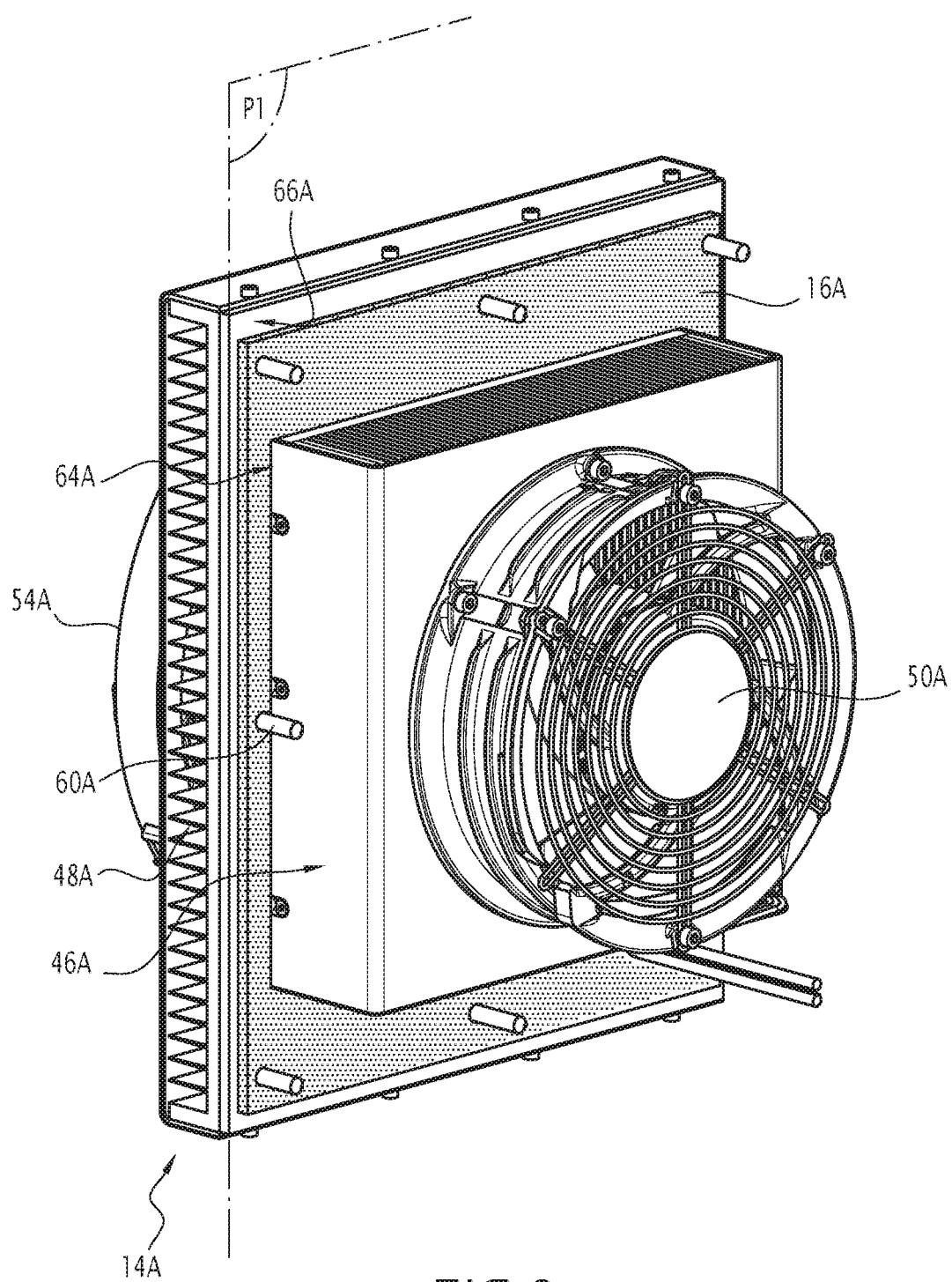
FIG. 2 shows a perspective representation, viewed from an inner side, of one of the cooling modules of FIG. 1.
Figure 3:
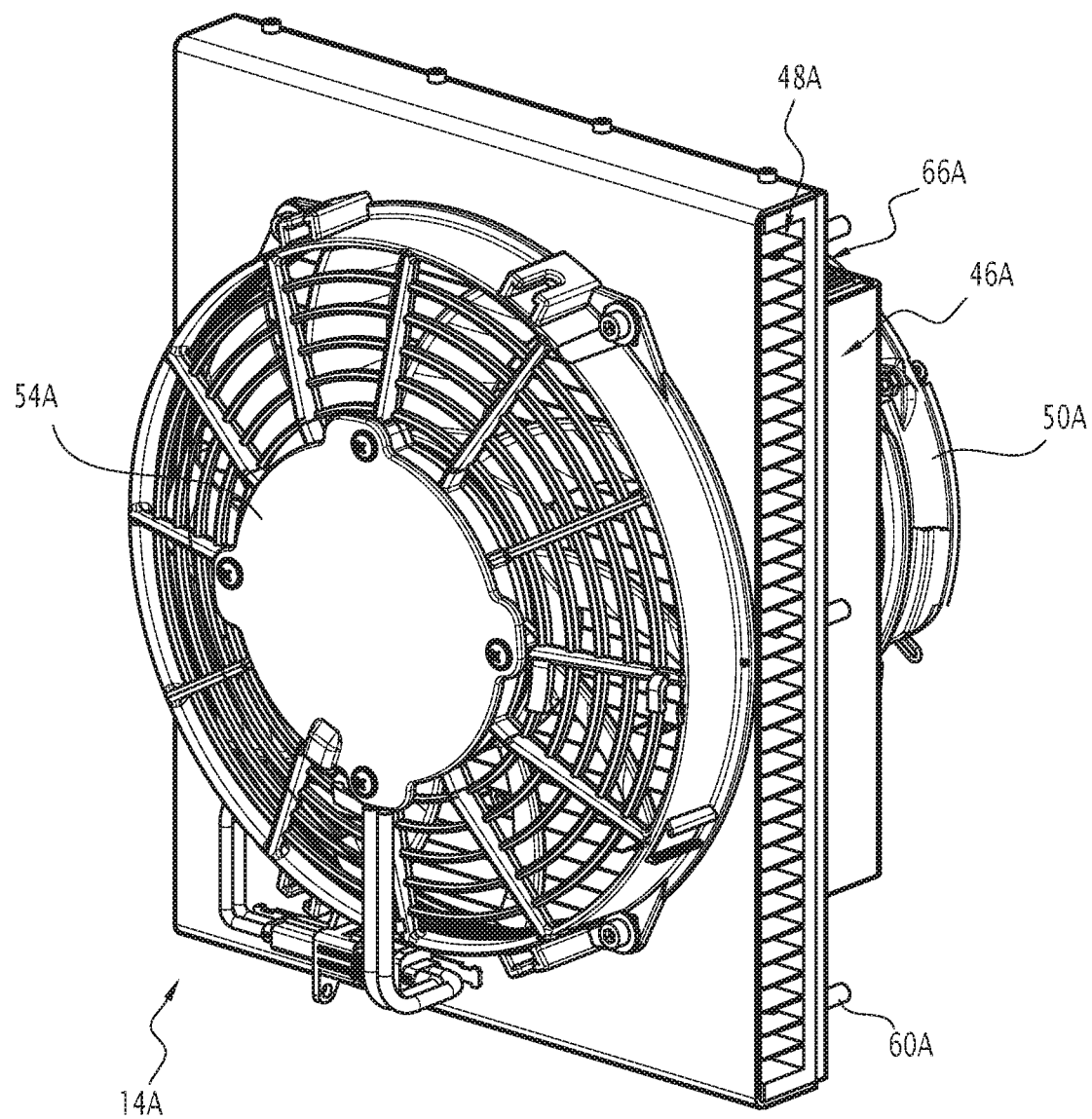
FIG. 3 shows a perspective representation, viewed from an outer side of one of the cooling modules of FIG. 1.
Figure 4:
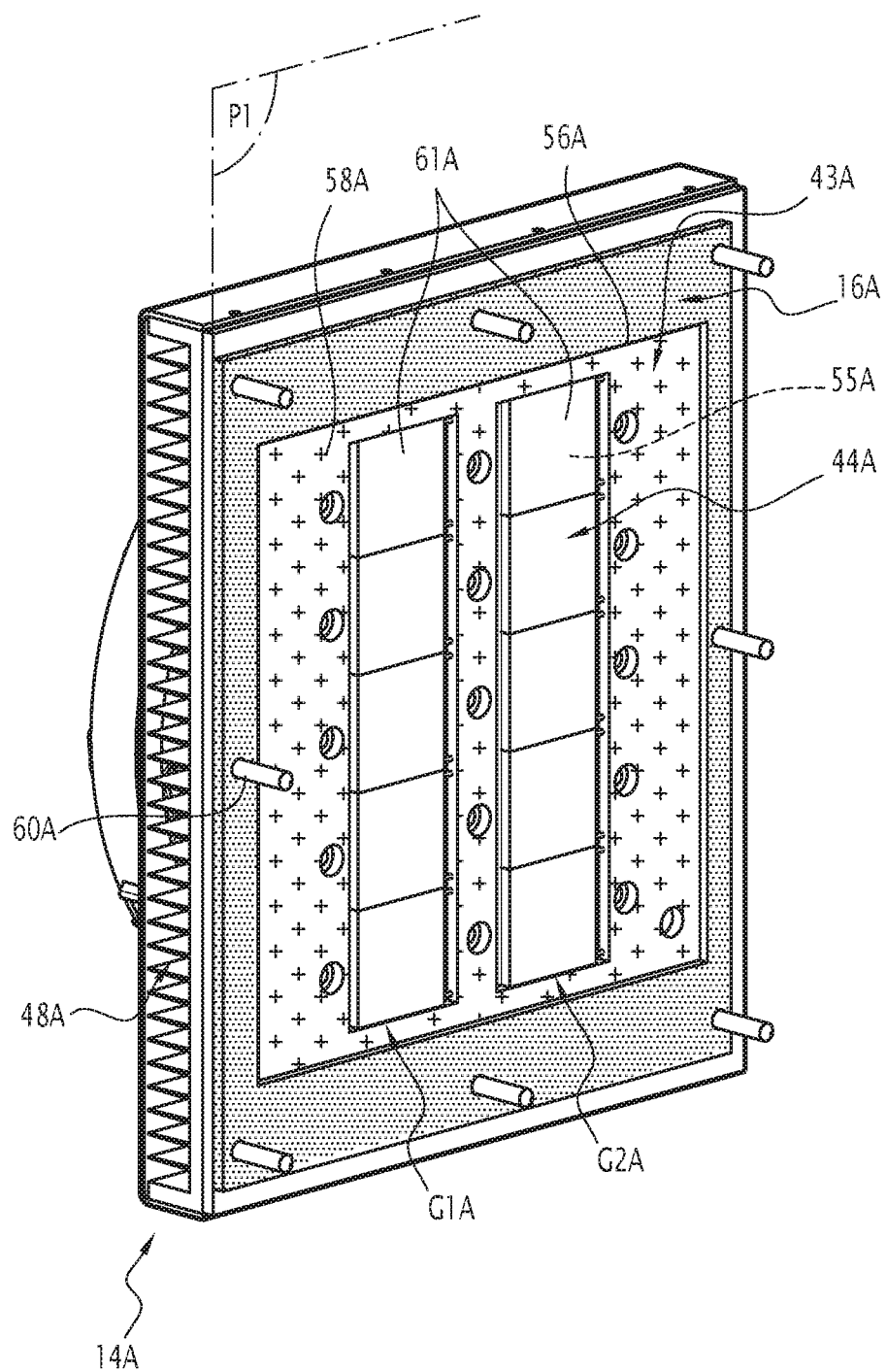
FIG. 4 shows a partial perspective representation of the cooling module of FIGS. 2 and 3, showing an assembly of Peltier effect cells fixed to an external heat sink.

The cooling module 14A, shown in FIGS. 2 to 4, comprises a heat insulation seal 43A, an assembly 44A of one or more Peltier effect cells, an internal heat sink 46A, an external heat sink 48A, and an internal fan 50A as well as an external fan 54A.

Peltier cells are elements known to those skilled in the art. Effectively, a Peltier effect cell consists of at least one pair of conductive elements of different types, preferably of semiconductor elements, comprising an N-type semiconductor element or a P-type semiconductor element. For each pair of semiconductor elements, the P-type semiconductor element is connected via an electrical conductor to the N-type semiconductor element, and the pair of the semiconductor elements is positioned between, and in contact with, two faces or heat exchange pads and is suitable to be powered by an electrical power supply source.

A Peltier effect cell generally associates several pairs of semiconductor elements. In the Peltier effect cell, the pairs of semiconductor elements are connected in series with each other pair, so as to form a series circuit with an alternation of P-type and N-type elements which succeed one another. The series circuit then comprises a first end formed by an N-type element and configured to be connected to a first electrical power supply terminal of the Peltier effect cell and a second end formed by a P-type element and configured to be connected to a second electrical power supply terminal of the Peltier effect cell.

The heat insulation seal 43A is of substantially planar shape and extends along a plane P1, which is parallel to the plane YZ when the cooling module is fixed to the housing 12, as shown in FIG. 1.

The heat insulation seal 43A subdivides the cooling module 14A into two on either side of the plane P1, so as to define an outer side, which is intended to be placed on the side of the outer space 30 of the housing 12, and an inner side, which is intended to be arranged on the side of the inner space 28 of the housing 12.

The heat insulation seal 43A separates the internal heat sink 46A and the external heat sink 48A. Specifically, the heat insulation seal 43A is wedged between the internal heat sink 46A and the external heat sink 48A.

The heat insulation seal 43A surrounds the assembly 44A. More specifically, the heat insulation seal defines a receiving housing 55A of the assembly 44A in which the assembly 44A is positioned. In the example of FIG. 4, the housing 55A is formed by two cutouts made in the material of the heat insulation seal 43A.

As shown in FIG. 4, the heat insulation seal 43A comprises a face 56A that contacts the external heat sink 48A referenced at its upper edge in FIG. 4 and extending parallel to the plane P1, and a face 58A in contact with the internal heat sink 46A and extending parallel to the plane P1.

The heat insulation seal 43A has, for example, in the plane P1, a surface generally equivalent to the surface of the internal heat sink 46A.

Advantageously, the heat insulation seal 43A is suitable to fit into the receiving cutout 40A and has, for example in the plane P1, dimensions that are slightly smaller than those of the receiving cutout 40A.

As shown in FIG. 4, the assembly 44A advantageously comprises several Peltier effect cells 61A and is hereinafter referred to as a Peltier effect cell assembly.

The Peltier effect cell assembly 44A extends parallel to the plane P1 and opens on both the side of the contact face 58A with the internal heat sink 46A, and on the side of the contact face 56A with the external heat sink 48A.

In other words, the Peltier effect cell assembly 44A defines, on the inside, i.e. at the contact face 58A, an inner surface of heat transmission, extending parallel to the plane P1.

The Peltier effect cell assembly 44A also defines, on the outside, i.e. at the contact face 56A, an external heat transmission face, extending parallel to the plane P1.

The Peltier effect cell assembly 44A comprises, for example, as shown in FIG. 4, two groups G1A, G2A of five Peltier effect cells 61A.

The groups GIA, G2A are connected in parallel with each other and comprise five Peltier effect cells 61A connected in series with each other and positioned between the internal and external heat transmission faces.

The Peltier effect cell assembly 44A is able to modify the temperature of the external and internal heat transmission faces as a function of a power supply signal that it receives. More specifically, the Peltier effect cell assembly 44A is able to increase the temperature of the internal heat transmission face with respect to the external heat transmission face, when the supply signal of the assembly 44A has a first polarity, and to increase the temperature of the external heat transmission face with respect to the internal heat transmission face, when the supply signal of the assembly 44A has a second polarity opposite to the first polarity.

Like the heat insulation seal 43A, the Peltier effect cell assembly 44A subdivides the cooling module into two on either side of the plane P1, so as to define the outside and the inside.

The Peltier effect cell assembly 44A and the heat insulation seal 43A separate the internal heat sink 46A and the external heat sink 48A and are, in particular, wedged between the internal heat sink 46A and the external heat sink 48A.

The internal heat sink 46A is in thermal contact with the internal heat transmission face.

The internal heat sink 46A is suitable to accept a so-called internal air flow from the first inner volume 36 of the inner space 28 and to output it into the first inner volume 36 of the inner space 28.

The internal air flow is formed by air taken from the inner space 28 by the internal fan 50A, and then circulates through the internal heat sink 46A, and is output into the inner space 28 through side openings.

The internal heat sink 46A comprises an internal face 64A in contact with the Peltier effect cell assembly 44A, and, in particular, with the internal heat transmission face, positioned facing the external heat sink 48A.

The external heat sink 48A is in thermal contact with the external heat transmission face. The external heat sink 48A is suitable to accept a so-called external air flow from the outer space 30 and then to output it into the outer space 30.

The external air flow is formed by air taken from the outer space 30 by the external fan 54A, wherein it then flows through the external heat sink 48A and is output into the outer space 30 through side openings.

The internal heat sinks 48A and 46A isolate the internal airflow from the external airflow.

The external heat sink 48A comprises an outer face 66A in contact with the Peltier effect cell assembly 44A, and, in particular, with the external heat transmission face, positioned opposite the internal contact face 64A.

Thanks to the contact between, on the one hand, the external face 66A and the external heat transmission face and, on the other hand, the internal contact face 64A and the internal heat transmission face, the Peltier effect cell assembly 44A is suitable to modify the temperature of the inner face 64A and external face 66A, in order to modify the temperature of the internal and external air flows and thus the inner space 28 and outer space 30.

The external contact face 66A is advantageously a face fastened to the protective housing 12.

The external contact face 66A comprises, on its periphery, fastening means 60A on the side wall 18 of the protective housing 12.

The fastening means 60A are, for example, threaded rods, suitable to pass through holes (not shown) formed on the side wall 18 and to be secured to the side wall 18 by means of nuts.

The fixing means 60A are positioned around the assembly 44A and the internal heat sink 46A.

The external contact face 66A has an area greater than the area of the internal contact face 64A.

The internal fan 50A is associated with the internal heat sink 46A and is suitable to circulate the internal air flow through the internal heat sink 46A. The internal fan 50A is attached to the internal heat sink 46A.

In other words, the internal fan 50A is suitable to draw air into the inner space 28 in order to generate the internal airflow, which passes through the internal heat sink 46A and is output into the inner space 28.

The external fan 54A is associated with the external heat sink 48A and is suitable to circulate the external air flow through the external heat sink 48A. The external fan 54A is attached to the external heat sink 48A.

In other words, the external fan 54A is suitable to draw air into the outer space 30 in order to generate the external air flow, which passes through the external heat sink 48A and is output into the outer space 30.

Advantageously, the external fan 54A is in fluidic contact with the environment outside the train and is able to draw air in from the external environment.

The internal fan 50A is capable of being electrically powered independently of the external fan 54A, while the Peltier effect cell assembly 44A is suitable to be electrically powered independently of the external 54A and internal 54A fans.

The control member 15 is positioned in the second inner volume 38.

The control member 15 advantageously comprises a different power supply unit for each cooling module 14A, 14B, while each power supply unit comprises a different power supply source for the external fan 54A, the internal fan 50A and the assembly of Peltier effect cells 44A.

The control member 15 is suitable to independently control each power source of the Peltier effect cell assemblies 44A, 44B of each cooling module 14A, 14B.

More specifically, for each cooling module 14A, 14B, the control member 15 is able to control the power supply signal delivered to the Peltier effect cell assembly 44A, 44B and, in particular, to modify the polarity of the signal of the power supply.

The seal 16A is positioned between the external heat sink 48A and the protective housing 12.

More precisely, the seal 16A extends parallel to the external contact face 66A against the external contact face 66A and is wedged between the external contact face 66A and the protective case 12.

More generally, the seal 16A is positioned around the heat insulation seal 43A between the external contact face 66A and the side wall 18.

Advantageously and as shown in FIG. 4, the heat insulation seal 43A, the seal 16A and the Peltier effect cell assembly 44A have the same thickness along a measurement axis perpendicular to the plane P1.

Upon mounting the module on the housing by approaching the module from the outside, the seal 16A is compressed against the side wall 18 which surround the receiving cutout 40A by means of fixing means 60A. The seal 16A is suitable to ensure, advantageously, heat insulation between the protective housing 12 and the external heat sink 48A, while the heat insulation seal 43A is able to provide heat insulation between the external heat sink 48A and the internal heat sink 46A.

The seal 16A advantageously fulfills a dual function, i.e. a sealing function between the inner space 28 and the outer space 30 and a heat insulation function between the protective housing 12 and the external heat sink 48A. The fact that the heat insulation seal 43A is non-integral with the seal 16A, i.e. it is a separate part of the seal 16A, allows the seal 16A to be changed during a maintenance operation, without having to change the heat insulation seal 43A.

Advantageously, the seal 16A comprises rings to limit the compression of the seal 16A when it is positioned between the external contact face 66A and the protective housing 12. The rings are, for example, made of stainless steel and extend over the entire surface of the seal in contact with the protective housing 12.

In addition, the control of the power supply signal of the Peltier effect cell assembly 44A via the control member 15, makes it possible to control the temperature of the internal heat transfer face and thus to control the temperature at the internal heat sink 46A that is in contact with the internal heat transmission face. Controlling the temperature at the internal heat sink 46A then makes it possible to cool or heat the internal air flow that passes through the internal heat sink 46A and thus to control the temperature inside the protective casing 12 and, in particular, the inside of the first inner volume 36.

The cooling modules 14A, 14B ensure precise control of the temperature in the power supply compartment while taking up minimal space. Thus, the size of the power supply compartment 10 and its cooling modules 14A, 14B is reduced.

In addition, it is no longer necessary to install air ducts between the electrical supply compartment 10 and a remote cooling system. In fact, the temperature of the air in the inner space 28 is modified in a closed circuit, i.e. the internal air flow remains in the inner space and is simply brought into contact with the internal heat sink 46A thanks to the internal fan 50A.

Moreover, the use of two cooling modules 14A, 14B situated respectively in the first inner volume 36 and in the second inner volume 38 makes it possible to maintain a different temperature in each inner volume 36, 38 and to control the temperature in each inner volume 36, 38 independently.

In addition, the fact that the polarity of the power supply signal of the Peltier effect cell assembly 44A may be reversed, makes it possible to control the temperature in the inner space 28 by cooling the air of the inner space or by heating the air in the inner space. The electronic components positioned inside the power supply compartment are thus protected against thermal shocks and their service life is improved.

The fact that the external 54A and internal 50A fans, as well as the Peltier effect cell assembly 44A are suitable to be electrically powered independently of each other reduces the power consumption of the cooling modules according to the thermal environment of the electrical power supply compartment 10.

Alternatively, the supply compartment 10 may comprise a single cooling module fixed to the protective housing 12.

According to another variant, each cooling module 14A, 14B may comprise two external fans and/or two internal fans.

According to another variant, the power supply compartment 10 may comprise more than two cooling modules fixed to the protective housing 12.

The embodiments and variants envisaged above are suitable for being combined with one another to lead to other embodiments of the invention.

The invention claimed is:

1. An electrical power supply compartment of a railway vehicle comprising a protective housing defining an inner space and an outer space physically isolated from each other, and a first cooling module comprising:
   (a) a Peltier effect cell assembly comprising:
      (i) a Peltier effect cell of substantially flat shape and defining, on either side of the assembly, an outer side and an inner side;
      (ii) an internal heat transmission face on the inner side; and
      (iii) an external heat transmission face on the outer side;
   (b) an internal heat sink and an external heat sink, which are respectively in thermal contact with the internal heat transmission face and the external heat transmission face; and
   (c) an internal fan and an external fan, which are respectively associated with the internal heat sink and the external heat sink, and which are respectively capable of circulating an internal airflow through the internal heat sink and an external airflow through the external heat sink;
   wherein the internal fan, the external fan, and the Peltier effect cell assembly are all capable of being electrically powered independently of each other;
   wherein the first cooling module is fixed to the protective housing;
   wherein the external fan and the external heat sink are positioned in the outer space, and the internal fan and the internal heat sink are positioned in the inner space;
   wherein the protective housing comprises an inner wall dividing the inner space into a first inner volume and a second inner volume, which are sealed relative to each other, the electrical power supply compartment further comprising a second cooling module, said first cooling module being mounted on a wall of the protective housing between the outer space and the first inner volume, the second cooling module being mounted on a wall of the protective housing between the outer space and the second inner volume;
   wherein each cooling module further comprises a heat insulation seal;
   wherein the heat insulation seal defines a housing for receiving the Peltier effect cell assembly, and wherein the heat insulation seal further comprises a face in contact with the external heat sink and a face in contact with the internal heat sink; and
   wherein the heat insulation seal and the Peltier effect cell assembly have the same thickness.

2. The electrical power supply compartment according to claim 1, wherein the internal and external heat sinks isolate the internal and external air flows from each other.

3. The electrical power supply compartment according to claim 1, wherein the heat insulation seal which separates the internal heat sink and the external heat sink.

4. The electrical power supply compartment according to claim 1, wherein the heat insulation seal defines a housing for receiving the Peltier effect cell assembly, and wherein the heat insulation seal further comprises a face in contact with the external heat sink and a face in contact with the internal heat sink.

5. The electrical power supply compartment according to claim 1, wherein the internal fan is configured to take air from the inner space in order to generate an internal flow through the internal heat sink, the external fan is configured to take air from the outer space in order to generate an external air flow through the external heat sink, the internal heat sink is configured to output the internal air flow into the inner space, and the external heat sink is configured to output the external air flow into the outer space.

6. The electrical power supply compartment according to claim 1, wherein the protective housing comprises a cutout for receiving the cooling module, wherein the cooling module further comprises a fastener for the protective housing, and wherein the electrical power supply compartment further comprises, for the cooling module, a seal positioned between the external heat sink and the protective housing, the seal being compressed against a wall of the protective housing surrounding the receiving cutout via the fastener, and the seal providing heat insulation between the protective housing and the external heat sink.

7. A railway vehicle comprising the electrical power supply compartment according to claim 1, wherein the external fan is in contact with an environment outside the train and is able to take air from the outside environment.

8. A railway vehicle comprising:
   an electrical power supply compartment comprising a protective housing defining an inner space and an outer space physically isolated from each other; and
   a first cooling module and a second cooling module for the electrical power supply compartment, each of said first and second cooling modules comprising:
      (a) a Peltier effect cell assembly comprising:
         (i) a Peltier effect cell of substantially flat shape and defining, on either side of the assembly, an outer side and an inner side;
         (ii) an internal heat transmission face on the inner side; and
         (iii) an external heat transmission face on the outer side;
      (b) an internal heat sink and an external heat sink, which are respectively in thermal contact with the internal heat transmission face and the external heat transmission face; and (c) an internal fan and an external fan, which are respectively associated with the internal heat sink and the external heat sink, and which are respectively capable of circulating an internal airflow through the internal heat sink and an external airflow through the external heat sink;

wherein the internal fan, the external fan, and the Peltier effect cell assembly are all capable of being electrically powered independently of each other;

wherein the protective housing comprises an inner wall dividing the inner space into a first inner volume and a second inner volume, which are sealed relative to each other;

wherein the first cooling module is mounted on a wall of the protective housing between the outer space and the first inner volume, and the second cooling module is mounted on a wall of the protective housing between the outer space and the second inner volume;

wherein each cooling module further comprises a heat insulation seal;

wherein the heat insulation seal defines a housing for receiving the Peltier effect cell assembly, and wherein the heat insulation seal further comprises a face in contact with the external heat sink and a face in contact with the internal heat sink; and wherein the heat insulation seal and the Peltier effect cell assembly have the same thickness.

9. The electrical power supply compartment according to claim 1, wherein the first inner volume is capable of housing power components of an electrical power supply system of the railway vehicle, while the second inner volume is capable of housing control means of the electrical power supply control system.

\* \* \* \* \*